United States Patent
Cardinaux et al.

(10) Patent No.: US 10,404,907 B2
(45) Date of Patent: Sep. 3, 2019

(54) ELECTRONIC DEVICE, METHOD AND COMPUTER PROGRAM

(71) Applicant: Sony Corporation, Tokyo (JP)

(72) Inventors: Fabien Cardinaux, Stuttgart (DE); Stefan Uhlich, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/633,023

(22) Filed: Jun. 26, 2017

(65) Prior Publication Data
US 2018/0012334 A1    Jan. 11, 2018

(30) Foreign Application Priority Data
Jul. 7, 2016  (EP) .................... 16178465

(51) Int. Cl.
| | | |
|---|---|---|
| *H04N 5/232* | (2006.01) | |
| *G06T 3/40* | (2006.01) | |
| *H04N 5/262* | (2006.01) | |
| *H03M 7/30* | (2006.01) | |
| *H04N 19/176* | (2014.01) | |
| *H04N 19/132* | (2014.01) | |
| *H04N 19/90* | (2014.01) | |

(52) U.S. Cl.
CPC .......... *H04N 5/23229* (2013.01); *G06T 3/40* (2013.01); *H03M 7/3062* (2013.01); *H04N 5/23293* (2013.01); *H04N 5/2628* (2013.01); *H04N 19/132* (2014.11); *H04N 19/176* (2014.11); *H04N 19/90* (2014.11)

(58) Field of Classification Search
CPC .......... H04N 5/23229; H04N 5/23293; H04N 5/2628; H04N 19/132; H04N 19/176; H04N 19/90; H03M 7/3062; G06T 3/40
See application file for complete search history.

(56) References Cited

U.S. PATENT DOCUMENTS

2006/0083440 A1* 4/2006 Chen ................. H04N 5/23238
                                                       382/284
2014/0063314 A1* 3/2014 Sankaranarayanan ......................
                                                       H04N 5/23293
                                                       348/333.02

* cited by examiner

Primary Examiner — Daniel M Pasiewicz
(74) Attorney, Agent, or Firm — Xsensus LLP

(57) ABSTRACT

An electronic device includes compressed sensing circuitry including an image sensor to capture an image and output compressed sensing image data. There is processing circuitry to reconstruct in real-time a preview image of the compressed sensing image data. A display screen displays the preview image which has been reconstructed.

12 Claims, 4 Drawing Sheets

ELECTRONIC DEVICE, METHOD AND COMPUTER PROGRAM

TECHNICAL FIELD

The present disclosure generally pertains to the field of digital imaging.

TECHNICAL BACKGROUND

The common approach in digital imaging today is to capture as many pixels as possible and to later compress the captured image data by digital means. These common approaches visually require to first acquire the full signal and compress it in a second stage (e.g. JPEG image compression).

"Compressed sensing" (also named "compressive sensing") is a signal processing method which allows capturing and representing signals with a low number of measurements. The signal is then reconstructed from these measurements using an optimization process. Compressed sensing is particularly useful to capture high amount and high resolution data at low cost (e.g. low energy power, low storage space, etc.). Compressed sensing allows compressing high resolution signals (e.g. images) at the optics or sensors level. In addition, it allows fast and/or low power acquisition compared to standard compression techniques. These standard techniques are usually required to first acquire the full signal and then compress it in a second stage.

Compressed sensing thus is particularly useful for low power (e.g. wearable) devices or when very large amount of recording must be acquired and stored (e.g. 'always on' cameras as for life logging).

A drawback of compressed sensing is that the reconstruction process may be complex and slow. In most cases this makes it impossible to reconstruct the signal on a small (e.g., wearable) device in real time or in totality. For example, if a low power camera records continuously, the signal cannot be decoded on the device but could only be reconstructed offline on a larger computer. A full reconstruction of a very large amount of recorded images could be too costly in practice.

Although some techniques exist for reconstructing images from compressed sensing image data, it is generally desirable to provide fast alternative techniques for reconstructing images from compressed sensing image data.

SUMMARY

According to a first aspect the disclosure provides an electronic device, comprising a processor which is configured to reconstruct in real-time a preview image of compressed sensing image data.

According to a further aspect the disclosure provides a method comprising reconstructing in real-time a preview image of compressed sensing image data.

According to a still further aspect the disclosure provides a computer program comprising instructions that when executed cause a processor to reconstruct in real-time a preview image of compressed sensing image data.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Figure 1A:
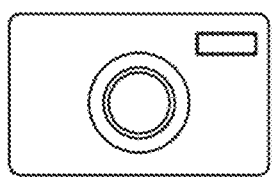
FIGS. 1a,b,c disclose three exemplifying electronic devices according to embodiments of the disclosure.

The disclosure provides an electronic device, comprising a processor which is configured to reconstruct in real-time a preview image of compressed sensing image data.

The electronic device may for example be a camera device, in particular a camera device that is based on a compressed sensing imaging technique. The electronic device may for example be a DSLR, a point-and-shot camera, a mobile phone with integrated camera or a wearable device such as a smart watch or the like. A compressed sensing camera in particular may allow to compress high resolution signals (e.g. images) at the optics or sensors level and may thus allow fast and/or low power acquisition.

A full reconstruction of compressed sensing image data typically is complex and slow so that the reconstruction, particularly on small devices (e.g. portable or wearable device), needs time and cannot be done in real-time. As the disclosed electronic device allows to reconstruct in real-time preview image of compressed sensing image data, the user may obtain a preview image without considerable time delays. For example, a user may take a picture and may then view a preview of the picture on a display screen of the device without having to wait a considerable amount of time. Compared to a full reconstruction of compressed sensing images, some embodiments provide methods to quickly extract a preview of compressed sensing compressed data at low computational cost. According to some embodiments, it becomes possible to reconstruct a preview of the recorded signal in real-time and on the device.

Any known compressed sensing techniques, in particular block compressed sensing techniques may be used to obtain the compressed sensing image data. The embodiments presented here allow to produce a preview image from compressed sensing image data without the need of altering the compressed sensing technique that is used to generate the compressed sensing image data. The technique may thus be added to an existing compressed sensing technique without altering the basic principle of the underlying compressed sensing technique.

According to some embodiments, the compressed sensing image data is for example obtained by a single-shot compressive sensing technique implemented by the electronic device. In single-shot compressive sensing the compression may, for example, be accomplished by optical means with a single exposure.

A preview image may for example be any image that comprises less information than the information contained in the compressed sensing image data. In this regard, a preview image may for example, be a low quality version of a compressed sensing image.

According to some embodiments, a preview image is used as a thumbnail image of a reconstructed image reconstructed from the compressed sensing image data. For example, the preview image may resemble a downsampled version of the reconstructed image.

According to some embodiments, the electronic device further comprises a display screen for displaying the preview image. A display screen may be for example a LCD screen, a OLED screen, or the like. Displaying a preview image of the images recorded by a compressed sensing camera in real-time on the device may for example be helpful to frame the captured scene correctly. Still further, when a large amount of data has been recorded (e.g. continuous recording), a camera user can look at the preview to select the parts to reconstruct in high quality.

According to some embodiments, the processor is further arranged to use the preview image by pattern recognition algorithms to find regions of interest automatically without reconstructing all recordings in high quality. This may be particularly helpful when a large amount of data has been recorded (e.g. during continuous recording).

According to some embodiments, the electronic device further comprises a recording medium on which the compressed sensing image data is recorded. The recording medium may for example be a SD, SDHC or SDXC card, miniSD or microSD, a Solid-State-Drive (SSD), or the like.

According to some embodiments, an upsampled version of the preview image is used as an initialization for a compressed sensing recovery algorithm. Using an upsampled version of the preview image as an initialization for a compressed sensing recovery algorithm may lead to a speed-up in recovering the original image from compressed sensing image data captured by the electronic device.

According to some embodiments, the processor may further be configured to apply, for generating the preview image, an algorithm that assumes that compressed sensing is done on multiple segments of an image individually. By assuming that compressed sensing is done on each segment individually may for example allow to have an easy thumbnail reconstruction. Image segments may for example correspond to blocks used in block compressed sensing techniques. For example, image segments may be regular (square) blocks, e.g., of size 16×16 pixels.

According to some embodiments, the processor may further be configured to estimate the original segment reconstructed from a measurement of the segment only and assuming that the segment is a uniform segment.

According to some embodiments, the processor may be configured to approximate each segment by a unique value that is computed based on an inner-product of a matrix that is a sum of rows of an H-matrix used in compressed sensing, and a local measurement that is obtained from a segment of the original signal.

Figure 1B:
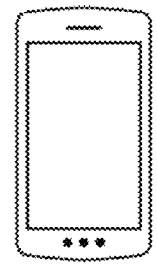
Figure 1C:
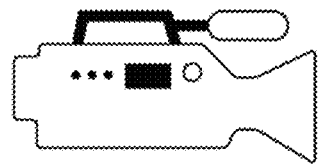

FIGS. 1a,b,c disclose three exemplifying electronic devices according to embodiments of the disclosure. FIG. 1a schematically displays a point-and-shoot camera, FIG. 1b schematically displays a smartphone, and FIG. 1c schematically displays a video camera.

Figure 2:
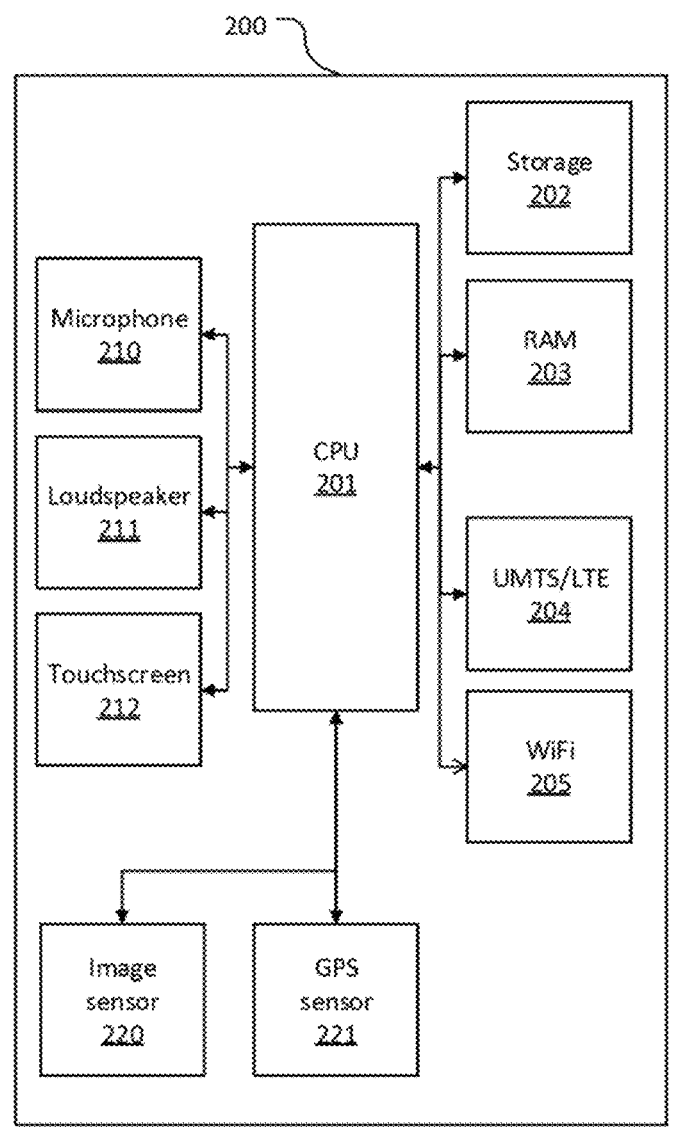
FIG. 2 schematically describes in more detail an embodiment of an electronic device that is used in context of the embodiments.

FIG. 2 schematically describes in more detail an embodiment of an electronic device 200 that may be used in context of the embodiments. The electronic device 200 comprises a CPU 201 as processor. The electronic device 200 further comprises a microphone 210, a loudspeaker 211, and a touchscreen 212 that are connected to the processor 201. These units 210, 211, 212 act as a man-machine interface and enable a dialogue between a user and the electronic device. The electronic device 200 further comprises an UMTS/LTE interface 204 and a WiFi-interface 205. These units 204, 205 act as I/O interfaces for data communication with external devices such as companion devices, servers, or cloud platforms. The electronic device 200 further comprises an image sensor 220 that is arranged to obtain compressed sensing image data. Image sensor 220 may in particular be based on a compressed sensing technique, e.g. it may allow to compress high resolution signals at the optics or sensors level and may thus allow fast and/or low power acquisition. The electronic device 200 further comprises a GPS sensor 221 for obtaining location information with regard to a location at which image capturing happens. The electronic device 200 further comprises a data storage 202 (e.g. a SD card) and a data memory 203 (e.g. a RAM). The data memory 203 is arranged to temporarily store or cache data or computer instructions for processing by processor 201. The data storage 202 is arranged as a long term storage, e.g. for recording image sensor data obtained from the image sensor 220. Touchscreen 212 may cooperate with CPU 201 to display a preview image of compressed sensing image data obtained from the image sensor 220.

It should be noted that the description above is only an example configuration. Alternative configurations may be implemented with additional or other sensors, storage devices, interfaces or the like. For example, in alternative embodiments, GPS sensor 221, UMTS/LTE interface 204, WiFi-interface 205, microphone 210 and/or loudspeaker 211 may be omitted, or replaced by other units. Likewise, touch screen 212 may for example be replaced by a display device that is not touch sensitive.

In the following, an embodiment of an algorithm is disclosed which may be implemented in a processor of an electronic device to reconstruct in real-time a preview image of compressed sensing image data.

Consider a set of measurements Y taken from an original signal (e.g., an image) X. The set of measurements $Y=\{y_1, \ldots, y_n, \ldots, y_N\}$ are taken such that the original signal X is splitted in N smaller segments (or block in case of 2D signals like an image) $X=\{x_1, \ldots, x_n, \ldots, x_N\}$ and each set of local measurements $y_n$ are taken from a segment of the original signal such as:

$$y_n = Hx_n \text{ with } H \in \mathbb{R}^{I \times J} \text{ and } I << J \quad (1)$$

with J being the length of a local segment of the original signal and I being the length of the corresponding measurement. By assuming that compressed sensing is done on each segment individually allows to have an easy thumbnail reconstruction as it will be shown below.

The idea is that instead of reconstructing the best possible $\{x'_1, \ldots, x'_n, \ldots, x'_N\}$ from measurements $\{y_1, \ldots, y_n, \ldots, y_N\}$ which would be slow and computationally expensive. Instead, the best segment $x'_n$ reconstructed from $y_n$ is estimated only and it is assumed that $x'_n$ is a uniform segment, i.e., $x'_n = \alpha_n 1$. In effect, each segment is approximated by a unique value, thus reducing the resolution of the original signal by a factor of J (in 1D) or $\sqrt{J}$ (in 2D).

This optimization problem can be reduced to solving $\min_{\alpha_n} \|y_n - \alpha_n R\|^2$ with R being the sum of the rows of H, i.e., $R = H1$, where 1 is the (column) vector $(1, 1, \ldots, 1)$. The solution is given by $$\alpha_n = \frac{R^T y_n}{\|R\|^2},$$

i.e., it is a inner-product of R with $y_n$.

This approach allows reconstructing accurately the uniform segments of the signal but there is no guaranty for the high-frequency segments. However, the H matrices used in compressed sensing are usually constructed to preserve distances in the compressed domain and therefore the resulting approach can yield results close to down sampling the original signal by averaging. Moreover, many types of signals like natural images tend to be sparse in the gradient domain which yields satisfactory results.

Figure 3:
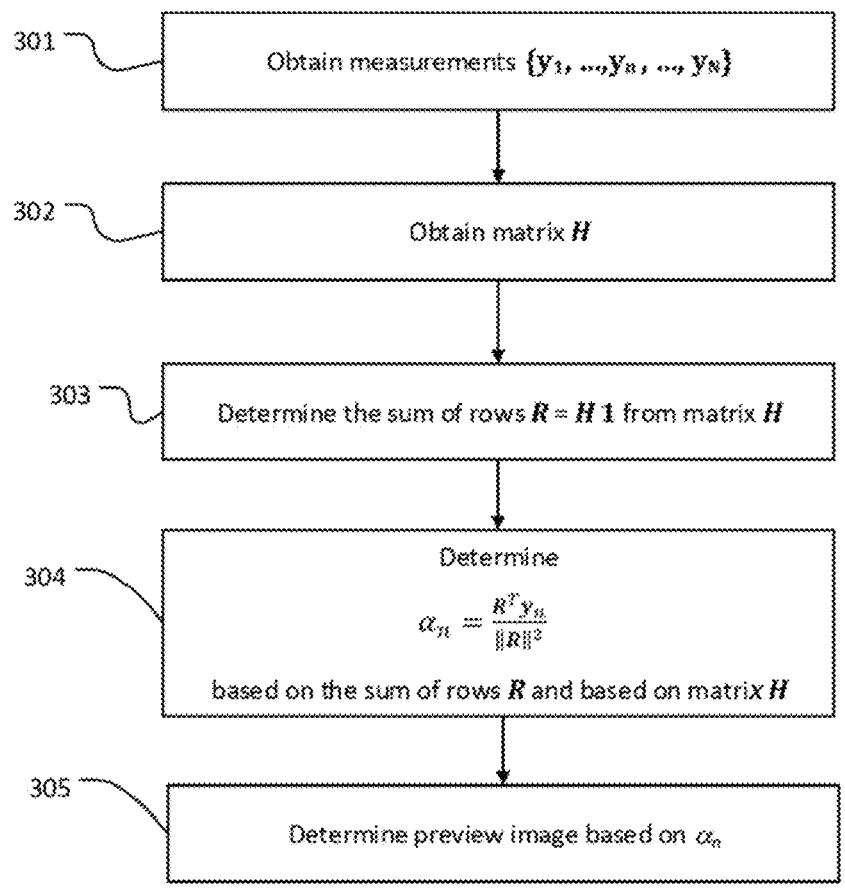
FIG. 3 shows an embodiment of a method of reconstructing in real-time a preview image of compressed sensing image data.

FIG. 3 shows an embodiment of a corresponding method of reconstructing in real-time a preview image of compressed sensing image data. At 301, measurements $\{y_1, \ldots, y_n, \ldots, y_N\}$ are obtained, e.g. by reading compressed sensing image data from a storage memory (e.g. 202 in FIG. 2). At 302, the H matrix used in generating the compressed sensing image data $\{y_1, \ldots, y_n, \ldots, y_N\}$ is obtained from an internal memory of the electronic device (e.g. memory 203 in FIG. 2). At 303, a sum of rows R=H1 is obtained from matrix H. At 304, an inner-product of R with $y_n$ is calculated according to $$\alpha_n = \frac{R^T y_n}{\|R\|^2}.$$

Finally, at 305, a preview image is generated based on the values $\alpha_n$.

In the following an example of operation of an electronic device or method implementing the above algorithm is given.

The above algorithm may in particular be used for reconstructing preview images from images that have been obtained by single-shot block compressed sensing techniques in which each pixel of the sensor is accessed only once during signal readout.

To demonstrate the concept a compressed sensing camera has been simulated which generates measurements as described by Gan, Lu in "Block compressed sensing of natural images", 15th International Conference on Digital Signal Processing, IEEE, 2007, pages 403 . . . 406, and with H being a normally distributed random matrix of size 16×256.

Figure 4A:
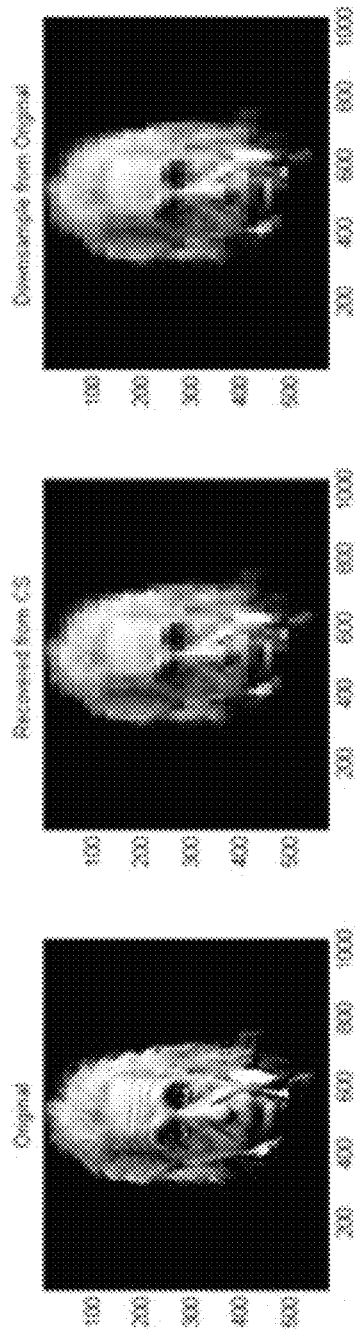
FIG. 4a shows a first example of a preview image that has been reconstructed in real-time from compressed sensing image data.

FIG. 4a shows a first example of a preview image that has been reconstructed in real-time from compressed sensing image data. The left image of FIG. 4a represents an original image. The image in the middle represents a preview image generated from compressed sensing measurement using the above disclosed algorithm. For comparison, the right image represents a downsampled version of the original image by block averaging.

Figure 4B:
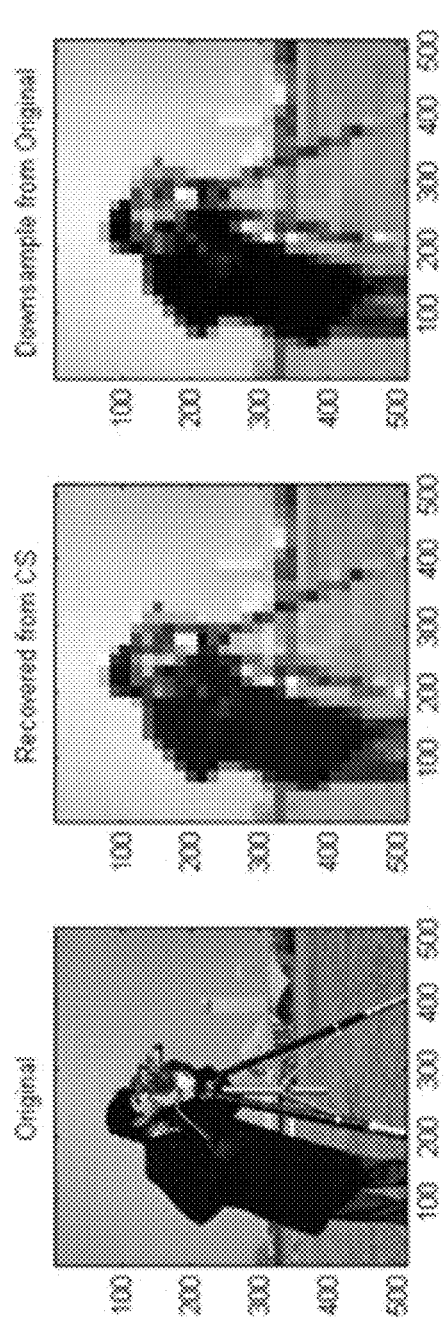
FIG. 4b shows a second example of a preview image that has been reconstructed in real-time from compressed sensing image data.

FIG. 4b shows a second example of a preview image that has been reconstructed in real-time from compressed sensing image data. The left image of FIG. 4b represents an original image. The image in the middle represents a preview image generated from compressed sensing measurement using the above disclosed algorithm. For comparison, the right image represents a downsampled version of the original image by block averaging.

It should be recognized that the embodiments describe methods with an exemplary ordering of method steps. The specific ordering of method steps is however given for illustrative purposes only and should not be construed as binding. For example the ordering of 301 and 302 in the embodiment of FIG. 3 may be exchanged. Other changes of the ordering of method steps may be apparent to the skilled person.

It should further be recognized that the division of the electronic device into units (such as exemplified in FIG. 2) is only made for illustration purposes and that the present disclosure is not limited to any specific division of functions in specific units.

In the embodiments described above, a method for controlling an electronic device, such as a digital camera device is described. The method can also be implemented as a computer program causing a computer and/or a processor to perform the method, when being carried out on the computer and/or processor. In some embodiments, also a non-transitory computer-readable recording medium is provided that stores therein a computer program product, which, when executed by a processor, such as the processor described above, causes the method described to be performed.

All units and entities described in this specification and claimed in the appended claims can, if not stated otherwise, be implemented as integrated circuit logic, for example on a chip, and functionality provided by such units and entities can, if not stated otherwise, be implemented by software. For example, CPU 201 of the embodiment of FIG. 2 may be implemented by a respective programmed processor, field programmable gate array (FPGA), or the like.

In so far as the embodiments of the disclosure described above are implemented, at least in part, using software-controlled data processing apparatus, it will be appreciated that a computer program providing such software control and a transmission, storage or other medium by which such a computer program is provided are envisaged as aspects of the present disclosure.

Note that the present technology can also be configured as described below.

(1) An electronic device, comprising a processor which is configured to reconstruct in real-time a preview image of compressed sensing image data.

(2) The electronic device of (1), in which the compressed sensing image data is obtained by a single-shot compressive sensing technique implemented by the electronic device.

(3) The electronic device of (1) or (2), in which the preview image resembles a thumbnail image of a reconstructed image reconstructed from the compressed sensing image data.

(4) The electronic device of anyone of (1) to (3), further comprising a display screen for displaying the preview image.

(5) The electronic device of anyone of (1) to (4), in which the processor is further arranged to use the preview image by pattern recognition algorithms to find regions of interest automatically without reconstructing all recordings in high quality.

(6) The electronic device of anyone of (1) to (5), further comprising a recording medium on which the compressed sensing image data is recorded.

(7) The electronic device of anyone of (1) to (6), in which an upsampled version of the preview image is used as an initialization for a compressed sensing recovery algorithm.

(8) The electronic device of anyone of (1) to (7), in which the processor is further configured to apply, for generating the preview image, an algorithm that assumes that compressed sensing is done on multiple segments of an image individually.

(9) The electronic device of anyone of (1) to (8), in which the processor is further configured to estimate the original segment reconstructed from a measurement of the segment only and assuming that the segment is a uniform segment.

(10) The electronic device of anyone of (1) to (9), in which the processor is configured to approximate each segment by a unique value that is computed based on an inner-product of a matrix that is a sum of rows of an H-matrix used in compressed sensing, and a local measurement that is obtained from a segment of the original signal.

(11) A method comprising reconstructing in real-time a preview image of compressed sensing image data.

(12) The method of (11), in which the compressed sensing image data is obtained by a single-shot compressive sensing technique implemented by the electronic device.

(13) The method of (11) or (12), in which the preview image resembles a thumbnail image of a reconstructed image reconstructed from the compressed sensing image data.

(14) The method of anyone of (11) to (13), further comprising displaying the preview image on a display screen.

(15) The method of anyone of (11) to (14), further comprising using the preview image by pattern recognition algorithms to find regions of interest automatically without reconstructing all recordings in high quality.

(16) The method of anyone of (11) to (15), further comprising recording the compressed sensing image data on a recording medium.

(17) The method of anyone of (11) to (16), in which an upsampled version of the preview image is used as an initialization for a compressed sensing recovery algorithm.

(18) The method of anyone of (11) to (17), for generating the preview image, an algorithm is applied that assumes that compressed sensing is done on multiple segments of an image individually.

(19) The method of anyone of (11) to (18), further comprising estimating the original segment reconstructed from a measurement of the segment only and assuming that the segment is a uniform segment.

(20) The method of anyone of (11) to (19), further comprising approximating each segment by a unique value that is computed based on an inner-product of a matrix that is a sum of rows of an H-matrix used in compressed sensing, and a local measurement that is obtained from a segment of the original signal.

(21) A computer program comprising instructions that when executed cause a processor to perform the method of anyone of anyone of (11) to (20).

(22) A non-transitory computer-readable recording medium that stores therein a computer program product, which, when executed by a processor, causes the method according to anyone of (11) to (20) to be performed.

The present application claims priority to European Patent Application 16178465.7 filed by the European Patent Office on 7 Jul. 2016, the entire contents of which being incorporated herein by reference.

The invention claimed is:

1. An electronic device, comprising:
compressed sensing circuitry including an image sensor to capture an image and output compressed sensing image data;
processing circuitry which is configured to reconstruct in real-time a preview image of the compressed sensing image data on multiple segments, individually; and
a display screen for displaying the preview image,
wherein the processing circuitry is further configured to reconstruct each of the multiple segments from an estimate of a corresponding one of the segments and assuming that the corresponding one of the segments is a uniform segment.

2. The electronic device of claim 1, in which the compressed sensing image data is obtained by a single-shot compressive sensing technique implemented by the electronic device.

3. The electronic device of claim 1, in which the preview image resembles a thumbnail image of a reconstructed image reconstructed from the compressed sensing image data.

4. The electronic device of claim 1, in which the processing circuitry is further arranged to use the preview image by pattern recognition algorithms to find regions of interest automatically without reconstructing all recordings in high quality.

5. The electronic device of claim 1, further comprising a recording medium on which the compressed sensing image data is recorded.

6. The electronic device of claim 1, in which an upsampled version of the preview image is used as an initialization for a compressed sensing recovery algorithm.

7. The electronic device of claim 1, in which the processing circuitry is configured to approximate each of the segments by a unique value that is computed based on an inner-product of a matrix that is a sum of rows of an H-matrix used in compressed sensing, and a local measurement that is obtained from the segments of the compressed sensing image data.

8. A method, comprising:
capturing an image and output compressed sensing image data;
reconstructing in real-time a preview image of the compressed sensing image data on multiple segments, individually; and
displaying the preview image,
wherein the reconstructing reconstructs each of the multiple segments from an estimate of a corresponding one of the segments and assuming that the corresponding one of the segments is a uniform segment.

9. The method of claim 8, in which the compressed sensing image data is obtained by a single-shot compressive sensing technique implemented by the electronic device.

10. The method of claim 8, in which the preview image resembles a thumbnail image of a reconstructed image reconstructed from the compressed sensing image data.

11. The method of claim 8, further comprising approximating each segment by a unique value that is computed based on an inner-product of a matrix that is a sum of rows of an H-matrix used in compressed sensing, and a local measurement that is obtained from a segment of the original signal.

12. A non-transitory computer readable medium including instructions that when executed cause a computer system to perform:
capturing an image and output compressed sensing image data;
reconstructing in real-time a preview image of the compressed sensing image data on multiple segments, individually; and
displaying the preview image,
wherein the reconstructing reconstructs each of the multiple segments from an estimate of a corresponding one of the segments and assuming that the corresponding one of the segments is a uniform segment.

* * * * *